(12) United States Patent
Gierak et al.

(10) Patent No.: US 7,365,348 B2
(45) Date of Patent: Apr. 29, 2008

(54) ADJUSTING DEVICE OF AN APPARATUS FOR GENERATING A BEAM OF CHARGED PARTICLES

(75) Inventors: Jacques Gierak, Le Plessis Pate (FR); Peter Hawkes, Toulouse (FR)

(73) Assignee: Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 11/758,770

(22) Filed: Jun. 6, 2007

(65) Prior Publication Data

US 2007/0228292 A1  Oct. 4, 2007

Related U.S. Application Data

(63) Continuation of application No. 11/245,072, filed on Oct. 7, 2005, now Pat. No. 7,238,956, which is a continuation of application No. 10/494,031, filed as application No. PCT/FR02/03937 on Nov. 18, 2002, now abandoned.

(30) Foreign Application Priority Data

Nov. 20, 2001  (FR)  .................................. 01 14990

(51) Int. Cl.
*G21G 4/00* (2006.01)
(52) U.S. Cl. .............................. 250/493.1; 250/492.21; 250/310; 250/398; 250/396 R; 250/423 R
(58) Field of Classification Search ............. 250/493.1, 250/492.21, 310, 423 R, 398
See application file for complete search history.

(56) References Cited

U.S. PATENT DOCUMENTS

| 5,132,545 | A | 7/1992 | Shono et al. |
| 5,519,216 | A | 5/1996 | Benner et al. |
| 5,721,687 | A | 2/1998 | Lamartine et al. |
| 6,177,680 | B1 | 1/2001 | Dick et al. |
| 6,583,426 | B1 | 6/2003 | Kawanami et al. |
| 6,667,483 | B2 | 12/2003 | Kobaru et al. |
| 6,822,245 | B2 | 11/2004 | Muto et al. |
| 6,825,480 | B1 * | 11/2004 | Watanabe et al. ......... 250/491.1 |
| 7,084,399 | B2 * | 8/2006 | Muto et al. ................. 250/309 |
| 7,238,956 | B2 * | 7/2007 | Gierak et al. ............ 250/493.1 |
| 7,259,373 | B2 * | 8/2007 | Zani et al. .................. 250/309 |

(Continued)

FOREIGN PATENT DOCUMENTS

EP  641 012  3/1995

(Continued)

*Primary Examiner*—Robert Kim
*Assistant Examiner*—Johnnie L Smith, II
(74) *Attorney, Agent, or Firm*—Oblon, Spivak, McClelland, Maier & Neustadt, P.C.

(57) ABSTRACT

An adjusting device of an apparatus for generating a beam of charged particles, wherein said beam is for interacting with a target and wherein said adjusting device comprises interface means for receiving, from a user of the apparatus, a set of desired values of characteristics of the beam of charged particles; means for determining a set of nominal values of adjusting parameters of the apparatus, corresponding to said characteristics and for passing them to the apparatus; means for measuring said adjusting parameters of the apparatus, and for computing corresponding values of said characteristics of the beam; and means for determining whether a correction of said values of adjusting parameters is necessary.

9 Claims, 1 Drawing Sheet

U.S. PATENT DOCUMENTS

Figure 1:
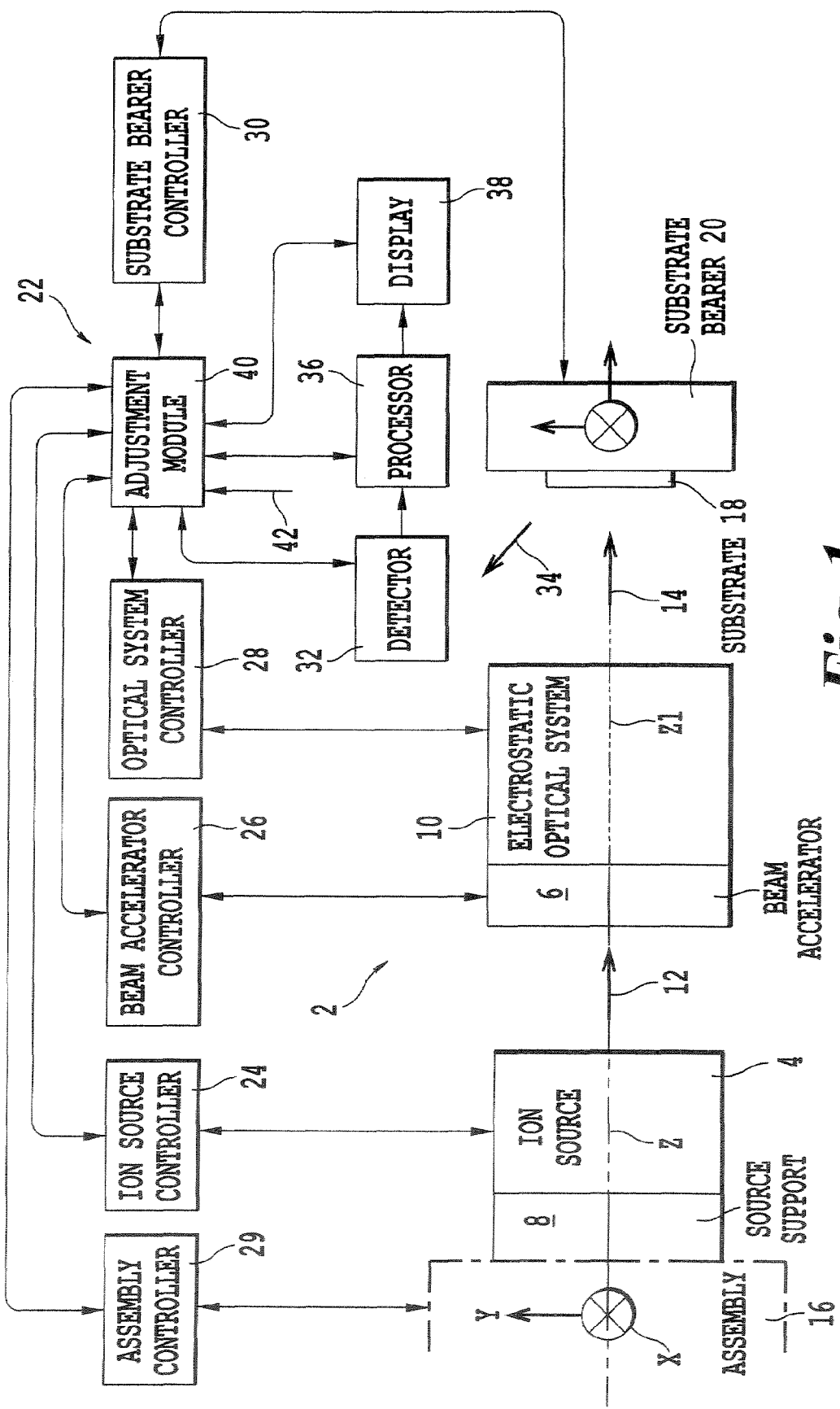

2004/0032575 A1* 2/2004 Nishi et al. .................... 355/53
2005/0258366 A1 11/2005 Honda et al.
2007/0045534 A1* 3/2007 Zani et al. ................... 250/309
2007/0278419 A1* 12/2007 Zani et al. ............... 250/432 R

FOREIGN PATENT DOCUMENTS

| JP | 4-105079 | 4/1992 |
| JP | 9-082266 | 3/1997 |
| JP | 11-219678 | 8/1999 |

* cited by examiner

ADJUSTING DEVICE OF AN APPARATUS FOR GENERATING A BEAM OF CHARGED PARTICLES

CROSS REFERENCE TO RELATED APPLICATIONS

This application is a continuation of U.S. application Ser. No. 11/245,072 filed on Oct. 7, 2005, now U.S. Pat. 7,238,956, which is a continuation of U.S. application Ser. No. 10/494,031 filed on May 7, 2004, now abandoned, which is a National Stage of PCT/FR02/03937 filed on Nov. 18, 2002, all of which claim priority to French Patent Application No. 01/14990 filed on Nov. 20, 2001. The contents of each of these documents are incorporated herein by reference.

TECHNICAL FIELD

The present invention relates to an adjusting device of an apparatus for generating a beam of charged particles.

The invention particularly relates to an adjusting device of an apparatus for generating an ion beam and more particularly to an adjusting device of an instrument for nanomanufacturing with an ion beam.

One tries to adjust in particular the size of an ionic probe i.e. the size of the focused ion beam which is sent onto a target, as well as the shape of the ion distribution in this ionic probe at the target are attempted.

The invention is in particular applied to the manufacture of structures with very small sizes, less than 50 nm, and more particularly to the manufacture of nanostructures with sizes of the order of 10 nm or less.

The invention finds applications in various fields such as electronics (in particular with regard to single electron devices—for example single electron transistors), ultra high density data storage (using nanostructures formed on magnetic materials) and ultra high speed semiconductor devices (using nanostructures formed on semiconducting materials).

The present invention is in particular applied to adjusting an ion beam emitted by an apparatus comprising an ion point source, i.e., an ion source with a very bright emissive point area.

Further, this ion point source is preferably an LMIS, i.e., a liquid metal ion source.

STATE OF THE PRIOR ART

Concerning liquid metal ion sources, one may refer to the following documents:

[1] International application PCT/FR 95/00903, International publication NO. WO 96/02065, invention of Jacques Gierak and Gérard Ben Assayag, corresponding to patent U.S. Pat. No. 5,936,251.

[2] U.S. Pat. No. 4,426,582, invention of J. H. Orloff and L. W. Swanson.

In addition, apparatuses generating ion beams called FIB and producing focused ion beams are known. But it should be noted that with these FIBs, it is not possible to manufacture good quality nanostructures with sizes less than 50 nm.

Further, a device for adjusting the shape of a focused ion beam is known from the following document:

[3] U.S. Pat. No. 4,704,726, invention of H. Kyogoku and T. Kaito (Seiko Instruments and Electronics Ltd.).

The adjusting technique disclosed in this document [3] is only a transposition of the adjusting technique conventionally used in scanning electron microscopy or ion beam lithography.

Such a technique cannot be used in the nanometric range.

Further, this known technique requires the preliminary manufacturing of costly and fragile calibration markers which are not reusable.

In addition, according to a known technique, for adjusting an apparatus generating an ion beam, it is the operator himself/herself who checks the various operating parameters of the ion optical system of the apparatus and who should make sure that the results of the adjustments give a theoretical resolution which is consistent with the intended use for the ion beam.

This step is delicate as it is subject to interpretation and compromise.

The operator is sometimes provided with tabulated data to facilitate his/her task, for example, the values of the ionic optical system's resolution versus the ionic probe current values for various distances between this ionic optical system (comprising a set of electrostatic lenses) and the target of the ion beam.

However, adjusting the apparatus remains delicate.

DISCLOSURE OF THE INVENTION

The object of the present invention is to find a remedy to the above drawbacks.

The invention in particular is directed to adding self-adjustment, self-diagnose and self-calibration capacity to an apparatus for generating an ion beam.

By adding such capacities to the apparatus, it is possible to improve and to widen the field of applications of this apparatus as well as the productivity of the latter, by almost totally excluding the intervention of an operator, i.e. a user of the apparatus.

More generally, the present invention proposes an adjusting device of an apparatus for generating a charge particle beam, with which the intervention of an operator is almost totally excluded.

Specifically, the object of the present invention, is an adjusting device of an apparatus for generating a beam of charge particles, in particular an ion or electron beam, wherein this beam is for interacting with a target, this device comprising means for:

- storing the desired characteristics for the particle beam, as determined by the user of the apparatus,
- determining the values of the adjustment parameters of the apparatus according to these characteristics and storing these values, and
- giving these stored values to the adjustment parameters of the apparatus.

According to a particular embodiment of the invention, the adjustment means are additionally for:

- continually or periodically measuring these parameters, when the beam of charged particles interacts with a target and determining the characteristics of the beam from these measurements:
- comparing the thereby determined characteristics with the stored characteristics, and
- if at least one of the thereby determined characteristics lies outside a predefined amplitude range, centered on the corresponding stored characteristic, changing the adjustment parameters of the apparatus and/or informing the user of the apparatus.

According to a preferred embodiment of the invention, the charged particles are ions, the target is a substrate, the apparatus comprises an ion source, means for accelerating these ions and means for focusing these ions, this apparatus is for manufacturing a structure, in particular a nanostructure, on the substrate, the ion beam is capable of eroding this substrate, and the adjustment means are for:

- storing the desired characteristics for the ion beam, as determined by the user of the apparatus according to the structure to be manufactured,
- determining the values of the adjustment parameters of the apparatus according to these characteristics and storing these values, and
- giving these stored values to the adjustment parameters of the apparatus.

Preferably, the adjustment means are further for:

- continually or periodically measuring these parameters, during the manufacturing of the structure, and determining the characteristics of the beam from these measurements,
- comparing the thereby determined characteristics to the stored characteristics, and
- if at least one of the thereby determined characteristics lies outside a predefined amplitude interval, centered on the corresponding stored characteristic, changing the adjustment parameters of the apparatus and/or informing the user of the apparatus.

The characteristics of the ion beam may comprise the size and the current density of this ion beam.

According to a particular first embodiment of the invention, the adjustment means are further for:

- measuring the adjustment parameters of the apparatus at any time or periodically during the manufacturing of the structure, and
- if at least one of the parameters drifts and therefore leaves a predefined amplitude range, centered on the corresponding stored parameter, changing the measured parameter so that it is again found in this range.

According to a particular second embodiment, the adjustment means are further for:

- measuring the adjustment parameters of the apparatus at any time or periodically during the manufacturing of the structure, and
- in the event of any instability of at least one of these parameters, interrupting the manufacturing process and informing the user and/or calibrating the apparatus for adjusting this parameter again.

The adjustment parameters may comprise the emission current of the ion source, the energy of the ions, the focusing of the ion beam, the amplitude of the writing field on the substrate, the correction of stigmatism and the distance between the apparatus and the substrate.

SHORT DESCRIPTION OF THE DRAWINGS

The present invention will be better understood upon reading the description of exemplary embodiments given hereafter, purely as an indication, and absolutely not as a limitation, by referring to the single appended FIGURE which is a schematic view of a particular embodiment of the device of the invention.

DETAILED DISCUSSION OF PARTICULAR EMBODIMENTS

In this FIGURE, an example of an apparatus 2 for generating an ion beam to which the invention may be applied, is illustrated schematically.

This apparatus 2 comprises an ion source 4 for example with a liquid metal, which is for producing an ion beam, for example, formed with gallium ions, a system 6 for extracting and accelerating the produced ion beam, a source support 8 and an electrostatic optical system 10.

The axis of the system 10 is marked as Z1 and the axis of the ion beam 12 emitted by the source 4 as Z, axes Z and Z1 being parallel.

The assembly formed by the source 4, its support 8 and the system 10 forms the focused ion column of the apparatus 2. System 10 essentially consists of electrostatic lenses (not illustrated) for focusing the beam 12 in order to form a focused ion beam 14.

In order to align the central axis Z of the emission cone of the ion beam 12 (axis of the source 4) with the optical axis Z1 of the electrostatic optical system 10, the source support is provided with a set 16 of micrometric stages. This set 16 symbolized by dot and dash lines in the figure allows the support 8 to be displaced along an X axis and a Y axis which are perpendicular to each other as well as to the Z axis.

The FIGURE also shows a substrate 18 to be treated by the focused beam 14 and forming a target for this beam (which is capable of eroding this substrate 18).

This substrate is mounted on a stage 20 which may be displaced along three axes respectively perpendicular to axes X, Y and Z.

The apparatus 2 is for manufacturing a nanostructure on the substrate 18.

Additionally, a control system 22 or an operating system of the device 2 for generating an ion beam is seen.

This system 22 comprises:

- means 24 for controlling the ion source 4,
- means 26 for controlling the system 6 for extracting and accelerating the ion beam 12,
- means 28 for controlling the electrostatic optical system 10, and
- means 29 for controlling the assembly 16 of micrometric stages.

Means 30 for controlling the displacement of the substrate bearing stage 20 are also seen.

A technique is considered in the following which is directed to solving the basic problem of the adjustment of the parameters of an ion column providing an ionic probe at the scale of tens of nanometers, in order to form nanometric size structures by controlled ion irradiation.

The geometrical shape (size), the profile (a more or less sharp decrease in the number of particles when moving away from the central axis of the beam) dominate, as well as the sphericity of the distribution in the ionic probe at the target. At a scale of a few nanometers, the problems are all the more complicated.

This technique is directed to providing a very accurate and fast adjustment of the profile of this ionic probe. The relevant points are:

- focusing (concentration) of the ion beam 12 under the action of the electrostatic lenses of the apparatus 2, at the target formed by the substrate 18, into a spot (impact) with nanometric dimensions,
- correcting the lack of sphericity of the incident ionic probe, and calibrating the writing field (a field which may be addressed by the beam under the action of electrostatic deflectors which the electrostatic optical system 10 comprises) at the surface of the target, so that the relative position is always accurately known within a few nanometers.

Use of an ion beam focused into a 10 nm spot for nanomanufacturing applications has specific constraints:

the sputtering effect induced by energetic ions which bombard the target, sooner or later leads to the destruction of the calibration structures (generally gold markers on silicon) which are conventionally used in electron beam lithography, for example).

Moreover, calibrated structures of a few tens of nanometers are delicate to manufacture, very brittle and expensive above all.

The period of use of the ion beam may attain several hours, which imposes periodic checks on the characteristics of this ion beam in order to limit the influence of drifts and transient instabilities.

The reduced working distances which are required for obtaining a geometrical magnification of the source spot less than 1, all the more reduce the usable depth of field.

Moreover, certain substrates include patterns with heights which highly differ from one another, so that these patterns are not all located at the ideal focal distance.

In the latter case, an ion which falls on such a substrate at the optical axis (Z1 axis) covers a much shorter path than another ion which has been deflected from this axis by several millimeters.

This optical path difference causes the occurrence of defects or aberrations.

In order to limit these aberrations to an acceptable value, the writing size is limited in a field of the order of a hundred micrometers.

Thus, without any appended device, the FIB nanomanufacturing technique can only form small elementary patterns When an ultra accurate displacement of substrate 18 is used, the possibility of linking up several elementary substructures occurs for defining a large size pattern. But this remains dependent on strict calibration of the size of the FIB elementary writing field.

Indeed, a most complete match as possible between the coordinates of the points defined within a scanning field and the displacement coordinates of the substrate bearing stage 20 is required.

All this is complex because the scanning of the ionic probe is obtained by means of a CAD (computer-aided design) generator of the digital/analog type (contained in the control means 28) whereas the stage 20, as far as it is concerned, is driven by control means 30 formed by a specific and independent interface 30.

It should also be noted that any variation in the distance between the substrate and the ionic column, in the energy of the ions or the nature of the latter, changes the value of the amplitude of the scanning field.

The proposed device particularly tends to improve and make the adjustment more effective of the parameters of a unique ionic column delivering an ionic probe at the scale of tens of nanometers, in order to form nanometric sized structures by controlled ion irradiation.

In particular, different levels of assistance are proposed to the user of an apparatus for generating a beam of charged particles and more particularly a beam of ions:

Determination of the optimal parameters for utilizing the apparatus according to the required operating conditions, i.e.:

selection of an optical mode for obtaining the required resolution (for example, the energizing voltage of the focusing lenses, working distance, semidivergent mode, semiconvergent mode or collimated mode (in the optical system) or the need for a "cross over" i.e. a crossing of charged particles, in particular, ions in the optical system), size of the writing field, detection of distortion effects and quantification of these effects, and then, in connection with the computer program of the pattern scanning generator (contained in the operating system 22 of apparatus 2), validation of these parameters or further detection of the impossibilities or conflicts between parameters (for example, the precision level of the scanning or the incident ion dose).

Determination of the parameterization of the ionic probe provided by the optical system:

characteristic of the current distribution (for example, width or standard deviation)

value of the transported current checking the adjustments of the apparatus:

An example of a device according to the invention is provided hereafter.

It is assumed that the intention is to accomplish a certain sequence of nanomanufacturing with apparatus 2.

According to the invention, the system 22 is completed by an adjustment module 40 or computation module.

This module 40, essentially including a computer, provides information to the operator (the user of the apparatus) via the display means 38. The operator, as far as he/she is concerned, is led to provide information (in particular data) to module 40, information which is symbolized by the arrow 42 in the figure.

Furthermore, for implementing the invention, the adjustment module 40 is connected to various control means 24, 26, 28, 29 and 30, which the operating system 22 of the apparatus 2 includes, in order to control these means 24, 26, 29 and 30.

The latter are equipped with suitable sensors (not shown) which allow them to know the state of various units 4, 6, 10, 16 and 20, which they control.

In addition, module 40 is connected to detection means 32 and electronic processing means 36 in order to control the operation of the apparatus in the scanning ion microscopy mode and to exploit the results from this operation.

According to the invention, adjustments are proposed to the operator, these adjustments being determined by the computation module. Then the operator starts the nanomanufacturing sequence.

Module 40 then continually (or periodically but then with a high frequency) computes the properties of the ionic probe (ion beam 14) during this nanomanufacturing sequence and compares the computational result to pre-established values, stored in this module 40.

If the values obtained during the calculation are different from these pre-established values, the module undertakes corrective measures by adjusting the parameters for adjusting the apparatus or, if the difference between the results of a calculation and the pre-established values is too large, module 40 informs the operator via the display means 38.

More specifically, according to the invention, the adjustment module 40 stores the desired characteristics for the ion beam 14, as determined beforehand by the user of the apparatus 2 according to the structure to be manufactured on the substrate 18.

Next, module 40 determines the values of the adjustment parameters of apparatus 2 according to these characteristics and stores these values.

And then the module gives these values which it has stored, to the adjustment parameters of the apparatus 2 via the control means 24, 26, 28 and 30, to which module 40 sends control signals enabling the desired adjustments to be made.

The characteristics of the ion beam 14 are the size of this ion beam and the current density in this beam.

The adjustment parameters of the ion column, as for them, are the following:

the emission current of the ion source 4,
the energy of the ions,
the voltages applied to the focusing lenses,
the amplitude of the scanning field, i.e., the amplitude of the writing field,
the correction of stigmatism of the ion beam 14,
the distance between the apparatus and the target 18, this distance being adjusted by displacing the stage 20 parallel with the Z1 axis.

It should be noted that when the operator wants to make a too large correction of stigmatism, the computation module 40 informs this operator about this via the display means 38.

Moreover, during the manufacturing of the structure on the substrate 18, module 40 may measure these parameters either continually or periodically (preferably with a high frequency) and determine the characteristics of the beam 14 from these measurements (which are made via means 24, 26, 28 and 30).

The module then compares the thereby determined characteristics with the stored characteristics. When one or more of these thereby determined characteristics differ (by a predefined percentage, for example ranging from −10% to +10%) from the corresponding stored characteristic, the module informs the operator and changes the adjustment parameters of the apparatus to obtain again the proper characteristics for beam 14.

If the differences are too large, module 40 may simply inform the operator and wait for instructions from the latter for proceeding with the manufacturing.

Further, module 40 may be programmed so as to act on the apparatus (via control means 24, 26 and 28 in the event of any drift of one or more parameters). Indeed, it should be noted that a manufacturing sequence generally lasts a long time, for example 2 hours.

As module 40 is able to (continually or periodically) measure the parameters, it may detect the drift of the latter and remedy it.

Moreover, module 40 may be programmed so that it interrupts the manufacturing sequence (and informs the operator about it) in the event of an instability of one or more parameters, i.e., in the event of a sudden change of the latter.

Further, it should be noted that the nanomanufacturing process takes place at a very low pressure; for one reason or another, this pressure may increase very rapidly; also, a problem of an electrical nature is liable to affect the apparatus 2; in such cases, the module 40 cannot act by itself and requires intervention of the operator.

The present invention is not limited to the adjustment of an apparatus for generating a (positive or negative) ion beam. It also applies to the adjustment of other apparatuses for generating beams of charged particles such as electron microscopes, the particles then being electrons.

What is claimed is:

1. An adjusting device of an apparatus for generating a beam of charged particles, wherein said beam is for interacting with a target and wherein said adjusting device comprises:
    interface means for receiving, from a user of the apparatus, a set of desired values of characteristics of the beam of charged particles;
    means for determining a set of nominal values of adjusting parameters of the apparatus, corresponding to said characteristics of the beam of charged particles, and for passing said set of nominal values to the apparatus;
    means for continually or periodically measuring said adjusting parameters of the apparatus, and for computing corresponding values of said characteristics of the beam of charged particles; and
    means for determining, on the basis of the differences of said computed values from said desired values of characteristics of the beam of charged particles, whether a correction of said values of adjusting parameters is necessary.

2. An adjusting device according to claim 1, further comprising means for determining changes of said values of adjusting parameters suitable for restoring the desired values of said characteristics of the beam of charged particles.

3. An adjusting device according to claim 2, wherein said means of determining whether a correction of said values of adjusting parameters is necessary are also adapted for determining if operation of the apparatus needs to be interrupted, in the event of instability of said adjusting parameters.

4. An adjusting device according to claim 1, wherein said interface means are also adapted for informing said user when a correction of said values of adjusting parameters is necessary.

5. An adjusting device according to claim 1, wherein said characteristics of the beam of charged particles comprise at least one of the following: spatial resolution on the target, size of the particle beams, electrical current carried by the beam.

6. An adjusting device according to claim 5, wherein said adjusting parameters comprise at least one of the following: optical mode emission current of a particle source, width or standard deviation of a current distribution, energy of the particles, voltages applied to particle focusing lenses, amplitude of a scanning field, correction of stigmatism of the particle beam, a distance between the apparatus and the target.

7. An apparatus for generating a beam of charged particles, comprising an adjusting device according to claim 1.

8. An apparatus to claim 7, wherein said charged particles are chosen between electrons and ions.

9. An apparatus according to claim 7, comprising one of an etching apparatus and a microscope.

* * * * *